(12) United States Patent
Dwari et al.

(10) Patent No.: US 12,405,293 B2
(45) Date of Patent: Sep. 2, 2025

(54) CURRENT SENSOR FOR POWER ELECTRONIC CONVERTER

(71) Applicant: Hamilton Sundstrand Corporation, Charlotte, NC (US)

(72) Inventors: Suman Dwari, Vernon, CT (US); Weilun Chen, Glastonbury, CT (US); Yongduk Lee, Manchester, CT (US); Sriram Chandrasekaran, Lucas, TX (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 265 days.

(21) Appl. No.: 18/336,630

(22) Filed: Jun. 16, 2023

(65) Prior Publication Data
US 2024/0418750 A1  Dec. 19, 2024

(51) Int. Cl.
*G01R 15/18* (2006.01)
*H03M 1/12* (2006.01)
*H03M 1/50* (2006.01)

(52) U.S. Cl.
CPC ........ *G01R 15/181* (2013.01); *H03M 1/1255* (2013.01); *H03M 1/504* (2013.01)

(58) Field of Classification Search
CPC .... G01R 15/181; H03M 1/1255; H03M 1/504
See application file for complete search history.

(56) References Cited

U.S. PATENT DOCUMENTS 6,741,533 B1 * 5/2004 Hiratsuka ............ G11B 7/0906
10,859,605 B2   12/2020 Hurwitz
(Continued)

FOREIGN PATENT DOCUMENTS

| EP | 2116854 B1 | 1/2011 |
| JP | 2001045741 A | 2/2001 |
| KR | 20220077804 A | 6/2022 |

OTHER PUBLICATIONS

Bayarkhuu et al., "Analog basis, low-cost inverter output current sensing with tiny PCB Coil implemented inside IPM" 2019 31st International Symposium on Power Semiconductor Devices and ICs (ISPSD). IEEE (May 2019) pp. 251-254.
(Continued)

*Primary Examiner* — Dominic E Hawkins
(74) *Attorney, Agent, or Firm* — CANTOR COLBURN LLP

(57) ABSTRACT

A system having: a power switching circuit providing a drive current to a load, and having: a power source; first and second serially connected switches convert DC power from the power source into AC current to form the drive current, or vice versa; a first high-bandwidth current sensor circuit measures high-side current pulses through the first switch and provides a first analog signal, proportional to the high-side pulses; a second high-bandwidth current sensor circuit measures low-side current pulses through the second switch and provides a second analog signal is proportional to the low-side pulses; a signal processing device coupled to the first and second current sensor circuits performs steps of: converting the first analog signal to a first digital signal and the second analog signal to a second digital signal; and reconstructing the drive current and obtaining its cycle average values from the first and second digital signals.

15 Claims, 3 Drawing Sheets

(56) References Cited

U.S. PATENT DOCUMENTS

| | | |
|---|---|---|
| 11,114,943 B2 | 9/2021 | Paolo et al. |
| 11,287,465 B2 * | 3/2022 | Mohamed Halick ........................ G01R 31/2617 |
| 11,437,917 B2 | 9/2022 | Yu et al. |
| 11,940,473 B2 * | 3/2024 | Kim .................... G01R 19/2506 |
| 2017/0155385 A1 | 6/2017 | Saarinen et al. |
| 2022/0170965 A1 | 6/2022 | Kim |
| 2023/0042621 A1 | 2/2023 | Kim et al. |

OTHER PUBLICATIONS

Kim et al., "Design of switching current sensor for three-phase SiC inverter" 2021 IEEE Applied Power Electronics Conference and Exposition (APEC). IEEE (Jun. 2021) pp. 2139-2146.
Search Report issued in European Patent Application No. 241819549; Mailed Nov. 11, 2024 (10 pages).
Zhou et al., "A differential compensated air coil current sensor for switching current measurement of power devices" IEEE Transactions on Industrial Electronics 70.5 (Jun. 2022) pp. 5356-5364.

* cited by examiner

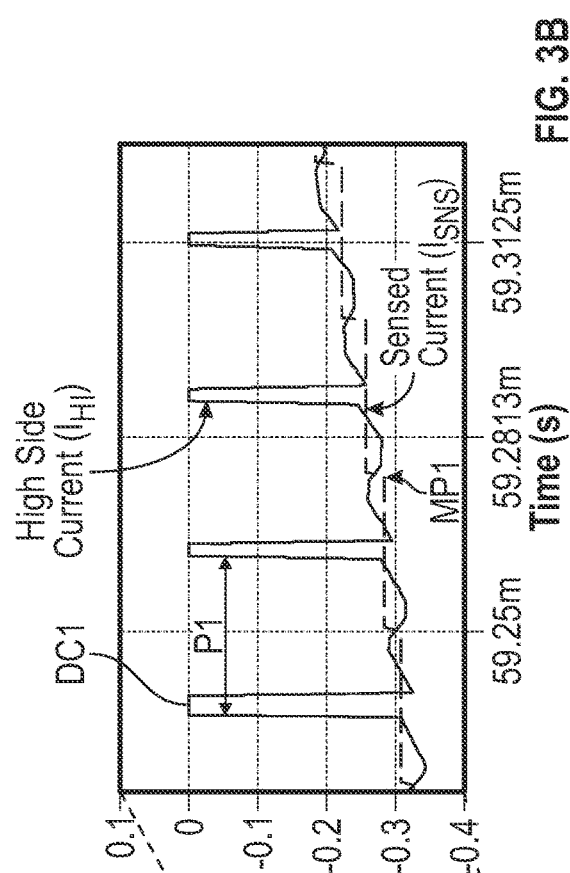
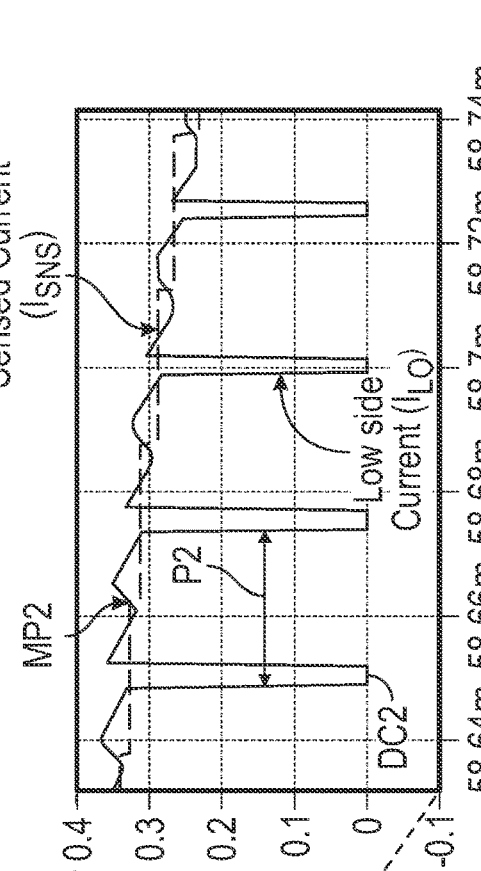
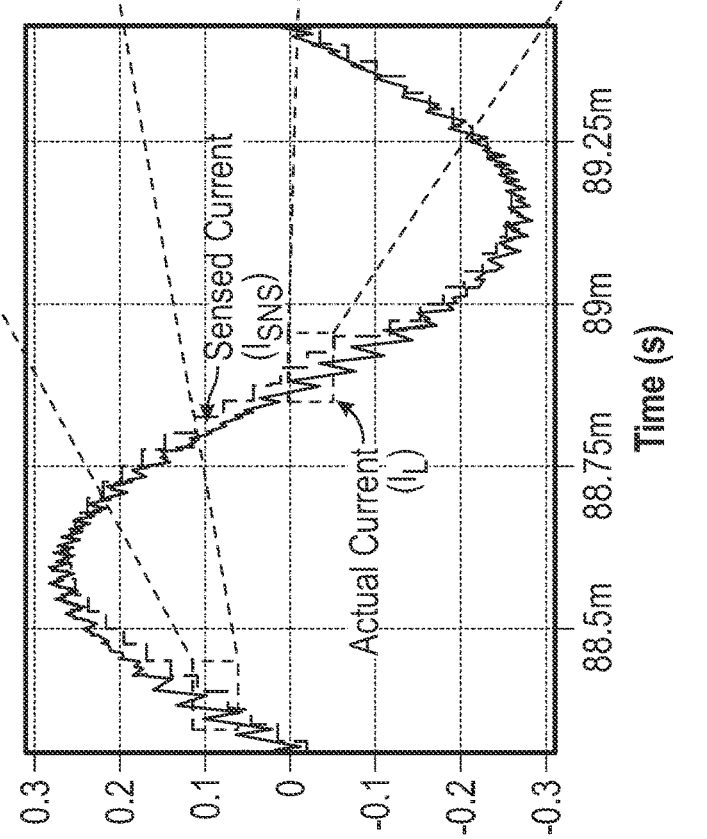
FIG. 3B
FIG. 3C
FIG. 3A

CURRENT SENSOR FOR POWER ELECTRONIC CONVERTER

BACKGROUND

The embodiments are directed to a current sensors and more specifically to a current sensor, having a Rogowski coil, sensing current from a power electronic converter.

Power electronic converters utilize current sensors for sensing and measure active device currents for protection and control purposes. Current sensors for converters may be costly, large, have a slow response and large losses.

BRIEF SUMMARY

Disclosed is a system, including: a power switching circuit that provides a drive current to a load, the circuit including: a power source; and first and second serially connected switches that convert DC power from the power source into an AC current to form the drive current, or vice versa; a first high-bandwidth current sensor circuit that measures a series of high-side current pulses through the first switch and provides a first analog signal that is proportional to the series of high-side pulses; a second high-bandwidth current sensor circuit that measures a series of low-side current pulses through the second switch and provides a second analog signal that is proportional to the series of low-side pulses; a signal processing device operationally coupled to the first and second current sensor circuits and is configured to perform steps including: converting the first analog signal to a first digital signal and the second analog signal to a second digital signal; and reconstructing the drive current and obtaining its cycle average values from the first and second digital signals.

In addition to one or more aspects of the system, or as an alternate, the signal processing device is a digital signal processor (DSP).

In addition to one or more aspects of the system, or as an alternate, the first switch operates on a first duty cycle and first switching period and the second switch operates on a second duty cycle and second switching period, and the duty cycles are complementary with the first duty cycle being greater than the second duty cycle.

In addition to one or more aspects of the system, or as an alternate, when reconstructing the drive current, the DSP is further configured to perform steps including, in each switching cycle: sampling the first digital signal at a first midpoint of one of the high-side pulses to obtain the first current sample and first duty cycle; and sampling the second digital signal at a second midpoint of one of the low-side pulses to obtain the second current sample and second duty cycle, wherein: when the first duty cycle is greater than a first threshold, the DSP is configured to generate a first output current for the switching cycle that is equal to the high-side pulse sensed while sampling the first digital signal; when the second duty cycle is greater than a second threshold, the DSP is configured to generate a second output current for the switching cycle that is equal to the low-side pulse sensed while sampling the second digital signal; and when the first duty cycle is not greater than the first threshold and the second duty cycle is not greater than the second threshold, the DSP is configured to generate a third output current for the switching cycle that is a sum of the high-side pulse and the low-side pulse that are sensed while sampling the first and second digital signals.

In addition to one or more aspects of the system, or as an alternate, the first and second thresholds are the same as each other.

In addition to one or more aspects of the system, or as an alternate, the first and second thresholds are 0.5.

In addition to one or more aspects of the system, or as an alternate, the first midpoint of the high-side pulse occurs at: $0.5*DC1*P1$ where DC1 is the first duty cycle and P1 is the first switching period; and the second midpoint of the low-side pulse occurs at: $0.5*DC2*P2$ where D2 is the second duty cycle and P2 is the second switching period.

In addition to one or more aspects of the system, or as an alternate, the DSP includes a first analog to digital converter (ADC) that converts the first analog signal to the first digital signal and a second ADC that converts the second analog signal to the second digital signal.

In addition to one or more aspects of the system, or as an alternate, the system further includes: a load branch extending from a first end to a second end, wherein the first end is connected to the power switching circuit between the first and the second switches and the second end is connected to a load.

In addition to one or more aspects of the system, or as an alternate, the system further includes an inductor disposed on the load branch, between the first and second ends.

In addition to one or more aspects of the system, or as an alternate, the load is a motor.

In addition to one or more aspects of the system, or as an alternate, the first switch is a first field-effect transistor (FET) having a first drain-source connection and the second switch is a second field-effect transistor (FET) having a second drain-source connection.

In addition to one or more aspects of the system, or as an alternate, the first and second FETs are first and second MOSFETS.

In addition to one or more aspects of the system, or as an alternate, the first current sensor circuit includes a first Rogowski coil wound about the first drain-source connection and the second current sensor circuit includes a second Rogowski coil wound about the second drain-source connection.

In addition to one or more aspects of the system, or as an alternate, the first current sensor circuit includes a first integration circuit and the second current sensor circuit includes a second integration circuit.

BRIEF DESCRIPTION OF THE DRAWINGS

The present disclosure is illustrated by way of example and not limited in the accompanying figures in which like reference numerals indicate similar elements.

FIG. 3A shows an example reconstructed drive current;

FIG. 3B shows a portion of the reconstructed drive current from a signal received from a high-side of the power converter; and FIG. 3C shows a portion of the reconstructed current from a signal received from a low-side of the power converter.

DETAILED DESCRIPTION

Aspects of the disclosed embodiments will now be addressed with reference to the figures. Aspects in any one figure is equally applicable to any other figure unless otherwise indicated. Aspects illustrated in the figures are for purposes of supporting the disclosure and are not in any way intended on limiting the scope of the disclosed embodiments. Any sequence of numbering in the figures is for reference purposes only.

Figure 1:
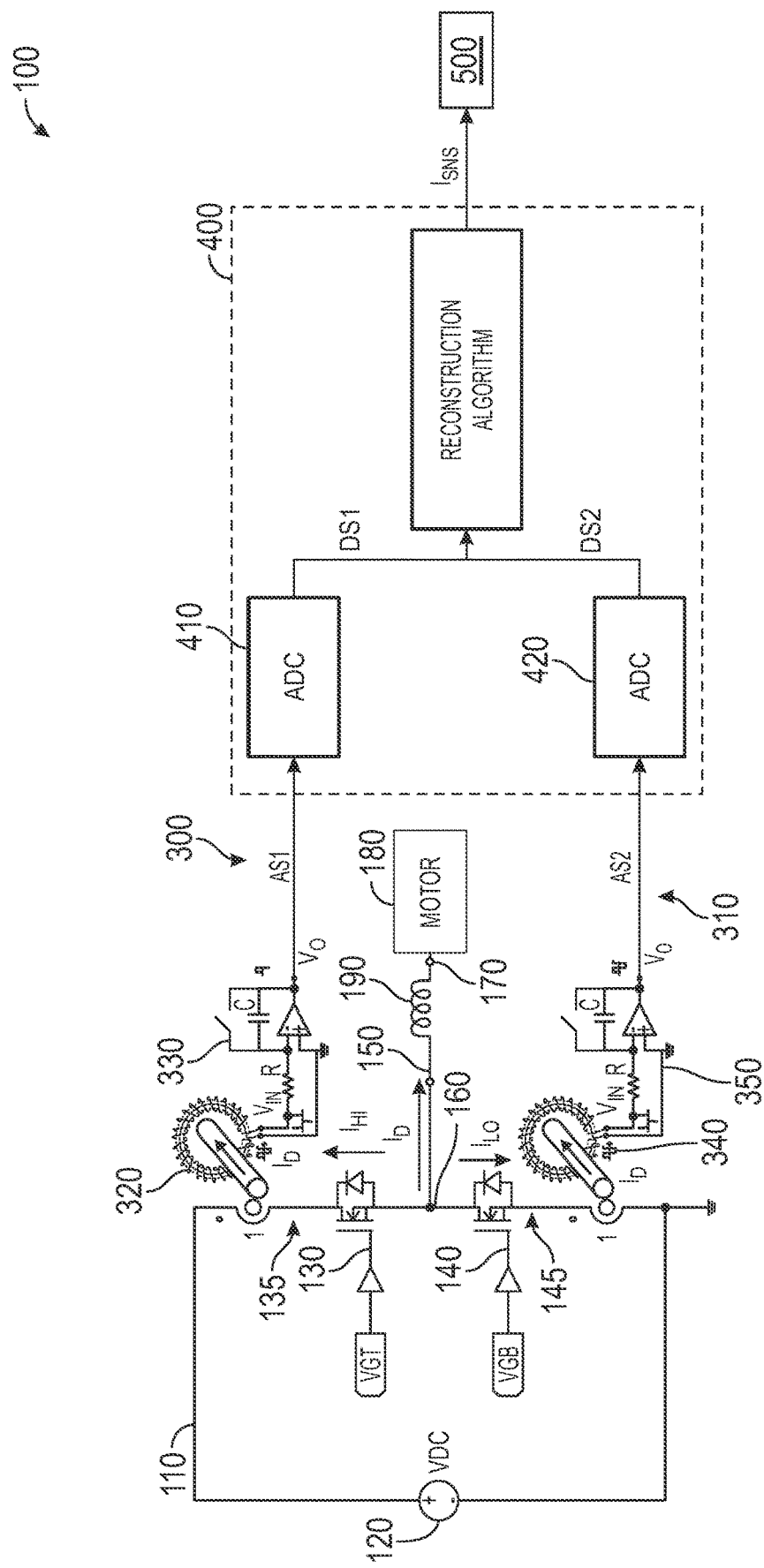
FIG. 1 shows a schematic of a system according to an embodiment having a power converter, current sensors, and a signal processing device such as a digital signal processor that reconstructs a drive current generated by the power converter.

Turning to FIG. 1, the disclosed system 100 includes a power converter, which is shown as an inverter in the form of a power switching circuit (or switching circuit) 110 having a power source 120 and first and second switches 130, 140. Between the first and second switches 130, 140, a load branch 150 is connected by its first end 160 and which extends to a second end 170 which is connected to a load 180 which may be a motor. An inductor 190, for conditioning power through the load branch 150, may be connected to the load branch 150 between its first and second ends 160, 170.

The switching circuit 110 converts DC power from the power source 120 to AC power so that the output is in the form of an AC drive current $I_D$. It is to be appreciated that the illustrated inverter 110 may be one leg of a two or three phase inverter that is typically utilized to power a motor 180. The power can also flow from the AC side (e.g., generator mode) to the DC side. That is, the power flow or current flow can be bi-directional. The disclosed embodiments are applicable for both modes of power flow.

The first switch 130 is configured to output a high-side pulse $I_{HI}$ of the drive current $I_D$, and the second switch 140 is configured to output a low-side pulse $I_{LO}$ of the drive current $I_D$. The first switch 130 may be a first field-effect transistor (FET), and more specifically a first MOSFET. The first switch 130 can have a gate, a drain and a source and includes both drain and source connections. As shown in FIG. 1, a sensor 300 (described below) is provided to measure current through the drain connection 135 of the switch. The second switch 140 may be a second field-effect transistor (FET), and more specifically a second MOSFET. The second switch 140 can have a gate, a drain and a source and includes both drain and source connections. As shown in FIG. 1, a sensor 310 (described below) is provided to measure current through the source connection 145 of the second switch 140. The first switch 130 operates on a first duty cycle DC1 (FIG. 3B) and first switching period P1 (FIG. 3B). The second switch 140 operates on a second duty cycle DC2 (FIG. 3C) and a second switching period P1 (FIG. 3C). The duty cycles may be complementary to each other, such that their sum is unity, and the first duty cycle DC1 may be greater than the second duty cycle DC2.

A first high-bandwidth current sensor circuit 300 is connected to the drain connection 135 and measures current thought the first switch 135. Herein, the current so measured can be pulsed as described above and thus, are shown as a high-side pulse $I_{HI}$. The measured current is output as a first low-voltage analog signal AS1 that is proportional to the high-side pulse $I_{HI}$. A second high-bandwidth current sensor circuit 310 is connected to the source connection 145 and measures current through the second switch 145. The currents so measured can be pulsed as described above and thus, are shown as a low-side pulse $I_{LO}$. The measured current is output as a second low-voltage analog signal AS2 that is proportional to the low-side pulse $I_{LO}$. The first current sensor circuit 300 includes a first Rogowski coil 320 wound about the drain connection 135. The first Rogowski coil 320 provides a signal to a first integration circuit 330. The second current sensor circuit 310 includes a second Rogowski coil 340 wound about the source connection 145. The second Rogowski coil 340 provides a signal to a second integration circuit 350.

The system 100 includes a signal processing device such as a digital signal processor (DSP) 400 with a first analog to digital converter (ADC) 410 that is operationally coupled to the first current sensor circuit 300. The first ADC 410 is configured to convert the first analog signal AS1 to a first digital signal DS1. The DSP 400 includes a second ADC 420 that is operationally coupled to the second current sensor circuit 310. The second ADC 420 is configured to convert the second analog signal AS2 to a second digital signal DS2. The DSP 400 includes a processor 430 configured to execute a reconstruction algorithm (FIG. 2 discussed below) to reconstruct the drive current $I_L$ (FIG. 3, discussed below), from cycle average values, utilizing the first and second digital signals DS1, DS2. The DSP 400 is configured to output a sensed signal $I_{SNS}$ representing the reconstructed drive current $I_L$ for further processing.

Generally, in the switching circuit 110, the Rogowski coils 320, 340 of the current sensor circuits 300, 310 are wound around the drain connection 135 of the first switch 130 and the source connection 145 of the second switch 140. The integrated Rogowski coil signals, i.e., signals AS1, AS2, represent the instantaneous switch currents and can be used for fast over-current protection, e.g., to prevent damaging the motor 180. According to the embodiments, the signals AS1, AS2 are utilized to reconstruct the sensed drive current $I_D$ (FIG. 3) as output by each phase leg, i.e., output as $I_{HI}$, $I_{LO}$. The reconstructed drive current is obtained by directly passing the sensor outputs AS1, AS2 to the ADCs 410, 420, which are integral parts of the DSP 400. The DSP 400 then applies the reconstruction algorithm on the ADC outputs DS1, DS2, to obtain the cycle average value of the drive current $I_D$. The reconstructed copy of the drive current $I_D$ may then be fed to a controller 500 can be used for protecting the motor 180 by controlling the inventor 110 as one example or, as other examples, a dc-to-ac converter, a dc-dc converter, etc.

Turning FIG. 2, a flowchart shows a current reconstruction process executed by the DSP 400, which will be discussed in greater detail below, and FIGS. 3A-3C show the reconstructed signal. Generally, midway through each respective ON period in a switching cycle, the DSP 400 samples the output signal AS1, AS2 from each sensor circuit 300, 310. These samples represent the output signals at a mid-point MP1, MP2 of each current pulse $I_{HI}$ and $I_{LO}$. The DSP 400 then generates the reconstructed copy of the drive current $I_D$, shown in FIG. 3, based on the duty cycles DC1 and DC2 of the switches 130, 140. In the waveforms shown in FIGS. 3A-3C that exemplify the algorithm executed by the DSP 400, the sensed current $I_{SNS}$ is assigned to the low-side pulse when DS2 is large (e.g., >0.5), or to the high-side pulse when DS1 is large (e.g., >0.5). This algorithm executed by the DSP 400 avoids inaccurate sensing which can result from small duty cycles (or small duty cycle ratios).

Figure 2:
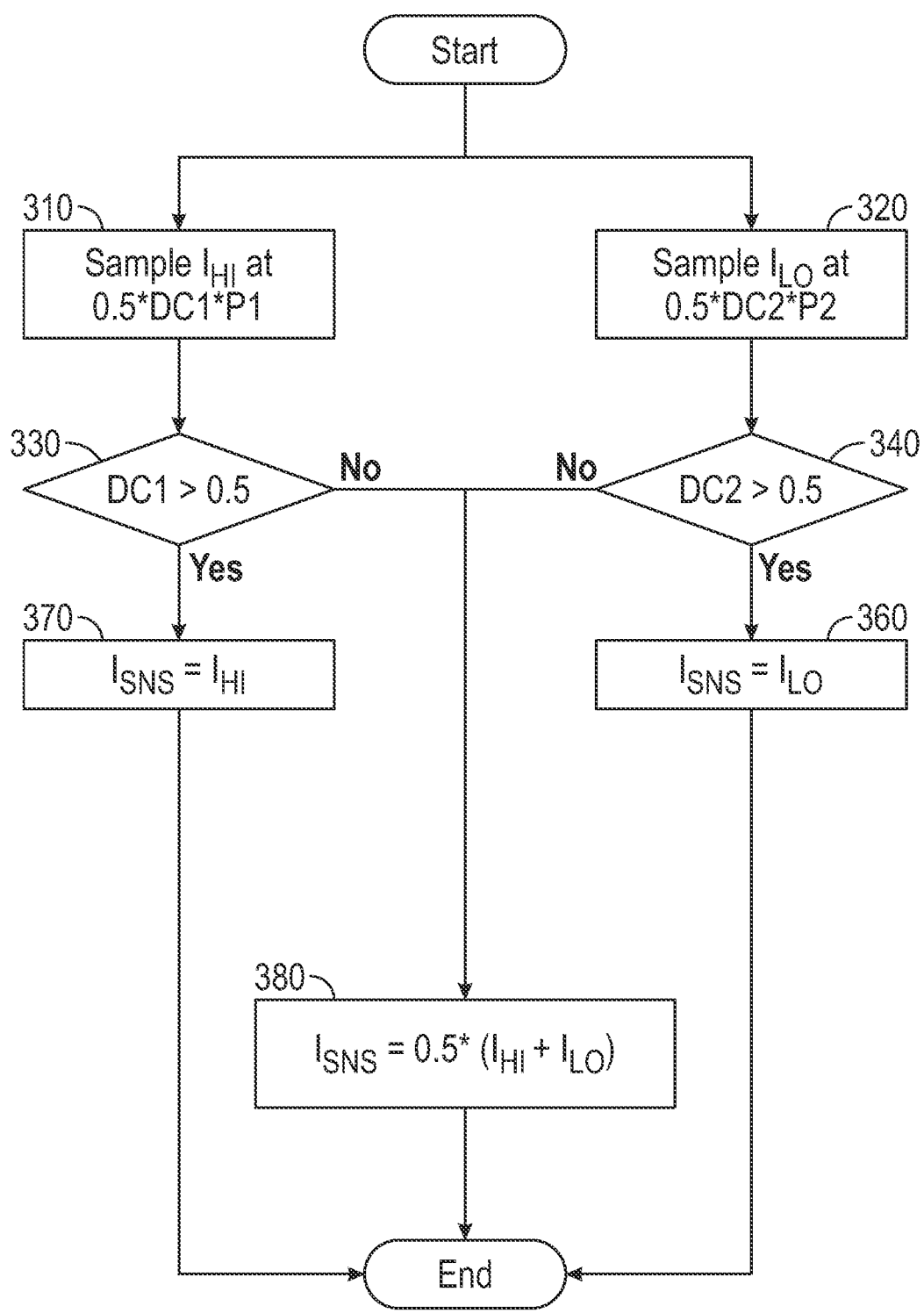
FIG. 2 is a flowchart showing a process executed by the digital signal processor for generating the reconstructed drive current.

More specifically, as shown in block 310 of FIG. 2, when reconstructing the drive current $I_D$, in each switching cycle, the DSP 400 is configured to perform the step of sampling the current sensor signal AS1 at the first midpoint MP1 of the high-side pulse $I_{HI}$ to obtain the first digital signal DS1 (FIG. 3B). The sample $I_{HI}$ is obtained at a time represented by 0.5*DC1*P1. As shown in block 320 the DSP is also configured to perform the step of sampling the second current sensor signal AS2 at a second midpoint MP2 of the low-side pulse $I_{LO}$ to obtain the second digital signal DS2 (FIG. 3C). Specifically, the sample $I_{LO}$ is obtained at 0.5*DC2*P2. The first period P1 may be the same as the second period P2, and the first duty cycle DC1 may be greater than the second duty cycle DC2, though these duty cycles may be complementary and add up to unity.

At block 330, the DSP 400 is configured to perform the step of determining whether the first duty cycle DC1 is greater than a first threshold, which may be 0.5. At block 340, the DSP 400 is configured to perform the step of determining whether the second duty cycle DC2 is greater than a second threshold, which may also be 0.5. If the determination at block 330 is YES, then the DSP 400 is configured to perform the step of generating an output sensed current $I_{SNS}$ (a first sensed current) for the switching cycle that is equal to the high-side pulse $I_{HI}$ sensed while sampling the first digital signal DS1. If the determination at block 340 is YES, then the DSP 400 is configured to perform the step of generating an output sensed current $I_{SNS}$ (a second sensed current) for the switching cycle that is equal to the low-side pulse $I_{LO}$ sensed while sampling the second digital signal DS2. Alternatively if, in either case, at block 330 and block 340, if the determination is NO, then the DSP 400 is configured to perform the step of generating an output sensed current $I_{SNS}$ (a third sensed current) for the switching cycle that is equal to half of the sum of the high-side pulse $I_{HI}$ sensed while sampling the first digital signal DS1 and the low-side pulse $I_{LO}$ sensed while sampling the second digital signal DS2.

The digital representation of the reconstructed sensed current $I_{SNS}$ overlayed on the actual drive current $I_D$ is shown in FIG. 3A, with a magnified portion of the graphed high-side pulse shown in FIG. 3B and the graphed low-side pulse shown in FIG. 3C. As can be seen, the reconstructed sensed current $I_{SNS}$ avoids the robust high and low side fluctuations associated with the actual current $I_L$.

Thus, the disclosed embodiments provide Rogowski coils 320, 330 integrated into current sensor circuits 300, 310, where the Rogowski coils 320, 340 are air-cored coils that can be directly connected to the switching circuit 110 to achieve a low loss, high bandwidth, and compact current sensing solution. The Rogowski coils 320, 340 can be used for high bandwidth sensing of the switch currents $I_{HO}$, $I_{LO}$, to provide rapid protection of devices. As an alternative to integrating the Rogowski coils 320, 340 into the switching circuit 110, they can be printed wire boards (PWBs) that include the switches 130, 140. With the digital controller 400, the embodiments enable a fast response for sensing high fundamental frequency currents and for achieving a fast response by sensing an accurate switching current for over current protection. The embodiments may eliminate the large spaces needed for magnetic cores and traditional current sensing. The embodiments may also eliminate power losses of current-sense resistors utilized in power converters.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A system, comprising:
a power switching circuit that provides a drive current to a load, the circuit comprising:
a power source; and
first and second serially connected switches that convert DC power from the power source into an AC current to form the drive current, or vice versa;
a first high-bandwidth current sensor circuit that measures a series of high-side current pulses through the first switch and provides a first analog signal that is proportional to the series of high-side pulses;
a second high-bandwidth current sensor circuit that measures a series of low-side current pulses through the second switch and provides a second analog signal that is proportional to the series of low-side pulses;
a signal processing device operationally coupled to the first and second current sensor circuits and is configured to perform steps including:
converting the first analog signal to a first digital signal and the second analog signal to a second digital signal; and
reconstructing the drive current and obtaining its cycle average values from the first and second digital signals.

2. The system of claim 1, wherein the signal processing device is a digital signal processor (DSP).

3. The system of claim 1, wherein the first switch operates on a first duty cycle and first switching period and the second switch operates on a second duty cycle and second switching period, and the duty cycles are complementary with the first duty cycle being greater than the second duty cycle.

4. The system of claim 3, wherein when reconstructing the drive current, the DSP is further configured to perform steps including, in each switching cycle:
sampling the first digital signal at a first midpoint of one of the high-side pulses to obtain the first current sample and first duty cycle; and
sampling the second digital signal at a second midpoint of one of the low-side pulses to obtain the second current sample and second duty cycle,
wherein:
when the first duty cycle is greater than a first threshold, the DSP is configured to generate a first output current for the switching cycle that is equal to the high-side pulse sensed while sampling the first digital signal;
when the second duty cycle is greater than a second threshold, the DSP is configured to generate a second output current for the switching cycle that is equal to the low-side pulse sensed while sampling the second digital signal; and
when the first duty cycle is not greater than the first threshold and the second duty cycle is not greater than the second threshold, the DSP is configured to generate a third output current for the switching cycle that is a sum of the high-side pulse and the low-side pulse that are sensed while sampling the first and second digital signals.

5. The system of claim 4, wherein the first and second thresholds are the same as each other.

6. The system of claim 4, wherein the first and second thresholds are 0.5.

7. The system of claim 4, wherein:
the first midpoint of the high-side pulse occurs at: 0.5*DC1*P1 where DC1 is the first duty cycle and P1 is the first switching period; and
the second midpoint of the low-side pulse occurs at: 0.5*DC2*P2 where D2 is the second duty cycle and P2 is the second switching period.

8. The system of claim 3, wherein the DSP includes a first analog to digital converter (ADC) that converts the first analog signal to the first digital signal and a second ADC that converts the second analog signal to the second digital signal.

9. The system of claim 3, further comprising:
a load branch extending from a first end to a second end, wherein the first end is connected to the power switching circuit between the first and the second switches and the second end is connected to a load.

10. The system of claim 9, including an inductor disposed on the load branch, between the first and second ends.

11. The system of claim 9, wherein the load is a motor.

12. The system of claim 2, wherein the first switch is a first field-effect transistor (FET) having a first drain-source connection and the second switch is a second field-effect transistor (FET) having a second drain-source connection.

13. The system of claim 12, wherein the first and second FETs are first and second MOSFETS.

14. The system of claim 2, wherein the first current sensor circuit includes a first Rogowski coil wound about the first drain-source connection and the second current sensor circuit includes a second Rogowski coil wound about the second drain-source connection.

15. The system of claim 2, wherein the first current sensor circuit includes a first integration circuit, and the second current sensor circuit includes a second integration circuit.

* * * * *